(12) United States Patent
Moon

(10) Patent No.: US 8,242,021 B2
(45) Date of Patent: Aug. 14, 2012

(54) METHOD FOR MANUFACTURING SEMICONDUCTOR DEVICE

(75) Inventor: Jae In Moon, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 1076 days.

(21) Appl. No.: 12/117,079

(22) Filed: May 8, 2008

(65) Prior Publication Data

US 2009/0163031 A1    Jun. 25, 2009

(30) Foreign Application Priority Data

Dec. 24, 2007  (KR) .................. 10-2007-0136952

(51) Int. Cl.
*H01L 21/311* (2006.01)

(52) U.S. Cl. ............ 438/696; 257/E21.023; 257/E21.57; 257/E21.347; 438/703; 438/705

(58) Field of Classification Search ................ None
See application file for complete search history.

(56) References Cited

U.S. PATENT DOCUMENTS

| | | | | |
|---|---|---|---|---|
| 6,271,113 | B1 | 8/2001 | Yoon et al. ................... 438/618 |
| 6,362,057 | B1 | 3/2002 | Taylor, Jr. et al. ............ 438/286 |
| 7,151,040 | B2 * | 12/2006 | Tran et al. ................... 438/401 |
| 7,268,054 | B2 * | 9/2007 | Tran et al. ................... 438/401 |
| 7,361,569 | B2 * | 4/2008 | Tran et al. ................... 438/401 |
| 7,368,362 | B2 * | 5/2008 | Tran et al. ................... 438/401 |
| 7,396,781 | B2 * | 7/2008 | Wells ........................... 438/448 |
| 7,455,956 | B2 * | 11/2008 | Sandhu et al. ............... 430/313 |
| 7,560,390 | B2 * | 7/2009 | Sant et al. .................... 438/717 |
| 7,651,950 | B2 * | 1/2010 | Ban .............................. 438/725 |
| 7,655,387 | B2 * | 2/2010 | Sandhu et al. ............... 430/314 |
| 7,666,578 | B2 * | 2/2010 | Fischer et al. ............... 430/314 |
| 7,718,540 | B2 * | 5/2010 | Tran et al. ................... 438/717 |
| 7,884,022 | B2 * | 2/2011 | Bai et al. ..................... 438/702 |
| 7,914,973 | B2 * | 3/2011 | Ryou et al. .................. 430/311 |
| 8,003,542 | B2 * | 8/2011 | Sant et al. .................... 438/717 |
| 8,030,222 | B2 * | 10/2011 | Tran et al. ................... 438/787 |
| 2006/0046422 | A1 * | 3/2006 | Tran et al. ................... 438/401 |
| 2006/0228854 | A1 * | 10/2006 | Tran et al. ................... 438/238 |
| 2006/0264000 | A1 * | 11/2006 | Tran et al. ................... 438/401 |

(Continued)

FOREIGN PATENT DOCUMENTS

KR    10-1999-001440    1/1999

(Continued)

OTHER PUBLICATIONS

Notice of Rejection for Korean Patent Application No. 10-2007-0136952, dated Mar. 27, 2009.

*Primary Examiner* — Allan Olsen

(74) *Attorney, Agent, or Firm* — Marshall, Gerstein & Borun LLP

(57) ABSTRACT

A method for manufacturing a semiconductor device includes forming a hard mask pattern and a spacer at both sides of the hard mask pattern. The method also includes forming a spacer pattern, so that the spacer remains in one direction to form a spacer pattern, forming a photoresist pattern having a pad type overlapping a side of the spacer pattern, and etching an underlying layer, with the photoresist pattern and the spacer pattern as a mask, to form an isolated pattern. The method improves resolution and process margins to obtain a highly-integrated transistor.

17 Claims, 10 Drawing Sheets

U.S. PATENT DOCUMENTS

| | | | |
|---|---|---|---|
| 2006/0264001 A1* | 11/2006 | Tran et al. | 438/401 |
| 2006/0264002 A1* | 11/2006 | Tran et al. | 438/401 |
| 2008/0261156 A1* | 10/2008 | Ryou et al. | 430/312 |
| 2009/0035584 A1* | 2/2009 | Tran et al. | 428/446 |
| 2009/0075485 A1* | 3/2009 | Ban et al. | 438/751 |
| 2009/0087959 A1* | 4/2009 | Ban | 438/401 |
| 2010/0092890 A1* | 4/2010 | Sandhu et al. | 430/313 |
| 2011/0124198 A1* | 5/2011 | Lee et al. | 438/735 |
| 2011/0269252 A1* | 11/2011 | Sant et al. | 438/9 |

FOREIGN PATENT DOCUMENTS

| | | |
|---|---|---|
| KR | 10-2003-0096563 | 12/2003 |

* cited by examiner (i)

(ii)

(i)

(ii)

(i)

(ii)

(i)

(ii)

(i)

(ii)

(i)

(ii)

(i)

(ii)

(i)

(ii)

METHOD FOR MANUFACTURING SEMICONDUCTOR DEVICE

CROSS-REFERENCES TO RELATED APPLICATIONS

The priority of Korean patent application No. 10-2007-0136952, filed Dec. 24, 2007, the disclosure of which is incorporated by reference in its entirety, is claimed.

BACKGROUND OF THE INVENTION

1. Field of the Invention

The invention generally relates to a method for manufacturing a semiconductor device, and more specifically, to a method for manufacturing a semiconductor device that does not require the manufacture of a dummy pattern to form an isolated pattern on a device, and improves resolution and process margins to obtain a highly-integrated transistor.

2. Brief Description of Related Technology

Semiconductor device pattern size is reduced as the devices become more highly integrated. In order to form a fine pattern, Various equipment and processes have been designed to form fine patterns for these devices. For example, a fine pattern may be obtainable by reducing an exposure wavelength, or by enlarging the size of a lens. However, these methods require new equipment development and increased manufacturing cost, which, in turn, results in difficulties in managing the equipment.

In an alternative method that uses conventional equipment employs a double exposure technology and a spacer patterning technology (SPT). FIGS. 1 and 2 are plane diagrams illustrating a conventional method for manufacturing a semiconductor device using SPT. FIG. 1 shows an isolated pattern 110 formed in a peripheral circuit region of a substrate 100. The isolated pattern 110 includes a line-type pattern 110a and a rectangular pad 110b formed on the line-type pattern 119a. A general photolithography process can be used to form patterns shown in FIG. 1. Photolithography methods, however, are limited by increased integration of the device. To overcome the limits, there are efforts to apply a light source having a short wavelength, an illuminator having high numerical aperture, and various resolution enhancement technology (RET) processes. The illuminator or the RET improves a margin of the photolithography process in dense patterns or half-dense patterns. However, the isolated pattern may reduce a margin in depth of focus (DOF).

In an etching process after the photolithography process for the isolated pattern of FIG. 1, a relatively larger bias is applied to the isolated pattern than to the dense pattern, which bias requires a smaller critical dimension in the etching process than in the photolithography process. During the photolithography process, a focus and an exposure latitude (EL) margin are reduced. To prevent the reduction, a method of forming a dummy pattern between an isolated pattern and its adjacent isolated pattern has been suggested.

FIG. 2 illustrates formation of a dummy pattern between isolated patterns. As shown, an isolated pattern 210 is formed over a semiconductor substrate 200, and a dummy pattern 220 is formed between the isolated patterns 210.

Although a method of forming a dummy pattern between isolated patterns has been suggested to increase a process margin and resolution of transistors in semiconductor device manufacturing methods, the process margin and resolution that can be increased by the dummy pattern are limited.

SUMMARY OF THE DISCLOSURE

Disclosed herein are various semiconductor device manufacturing methods that are directed at improving a depth of focus (DOF) margin and an exposure latitude (EL) margin to obtain a highly-integrated transistor.

According to one embodiment, a method for manufacturing a semiconductor device includes forming an underlying layer and a first hard mask layer over a semiconductor substrate, and forming a second hard mask pattern, the second hard mask pattern having a line type, over the first hard mask layer. The method also includes forming a spacer at sidewalls of the second hard mask pattern, and removing the second hard mask pattern so that the spacer remains. The method further includes removing a part of the spacer to form a spacer pattern, forming a photoresist pattern, the photoresist pattern having a pad type overlapping a part of the spacer pattern, over the first hard mask layer (including the spacer pattern), and etching the first hard mask layer, with the photoresist pattern and the spacer pattern as a mask to form a first hard mask pattern. The method also includes etching the underlying layer, with the first hard mask pattern as a mask, to form an underlying pattern.

According to another embodiment, a method for manufacturing a semiconductor device includes forming an underlying layer and a first hard mask layer over a semiconductor substrate, and forming a second hard mask pattern including a pad pattern and a line pattern over the first hard mask layer. The method also includes forming a spacer at sidewalls of the second hard mask pattern, removing the second hard mask pattern so that the spacer remains, and removing a part of the spacer to form a stepped-shaped spacer pattern. The method further includes forming a photoresist pattern, the photoresist pattern overlapping a part of the spacer pattern, over the first hard mask layer (including the spacer pattern). The method also includes etching the first hard mask layer, with the photoresist pattern and the spacer pattern as a mask, to form a first hard mask pattern, and etching the underlying layer, with the first hard mask pattern as a mask, to form an underlying pattern.

Additional features of the disclosed embodiments may become apparent to those skilled in the art from a review of the following detailed description, taken in conjunction with the drawings, and the appended claims.

BRIEF DESCRIPTION OF THE DRAWINGS

For a more complete understanding of the disclosure, reference should be made to the following detailed description and accompanying drawings wherein.

Figure 1:
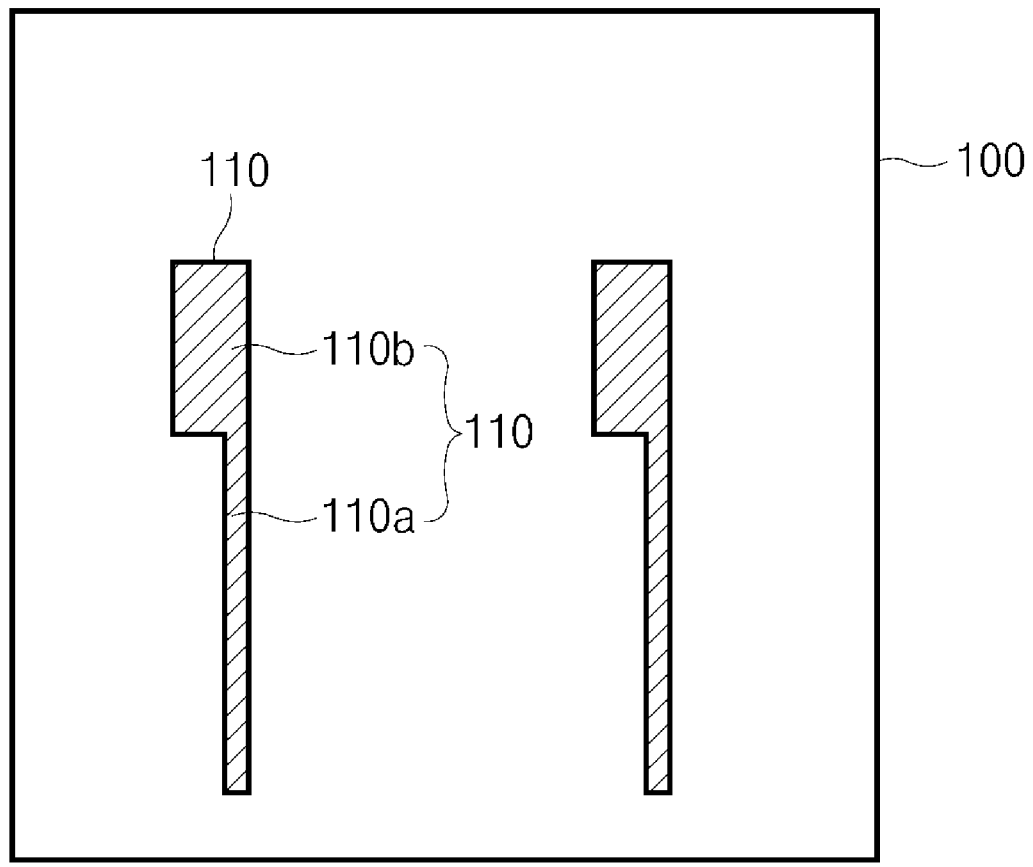
FIGS. 1 and 2 are plane diagrams illustrating a conventional method for manufacturing a semiconductor device; and, FIGS. 3a to 3h are diagrams illustrating a method for manufacturing a semiconductor device according to an embodiment of the invention.
Figure 2:
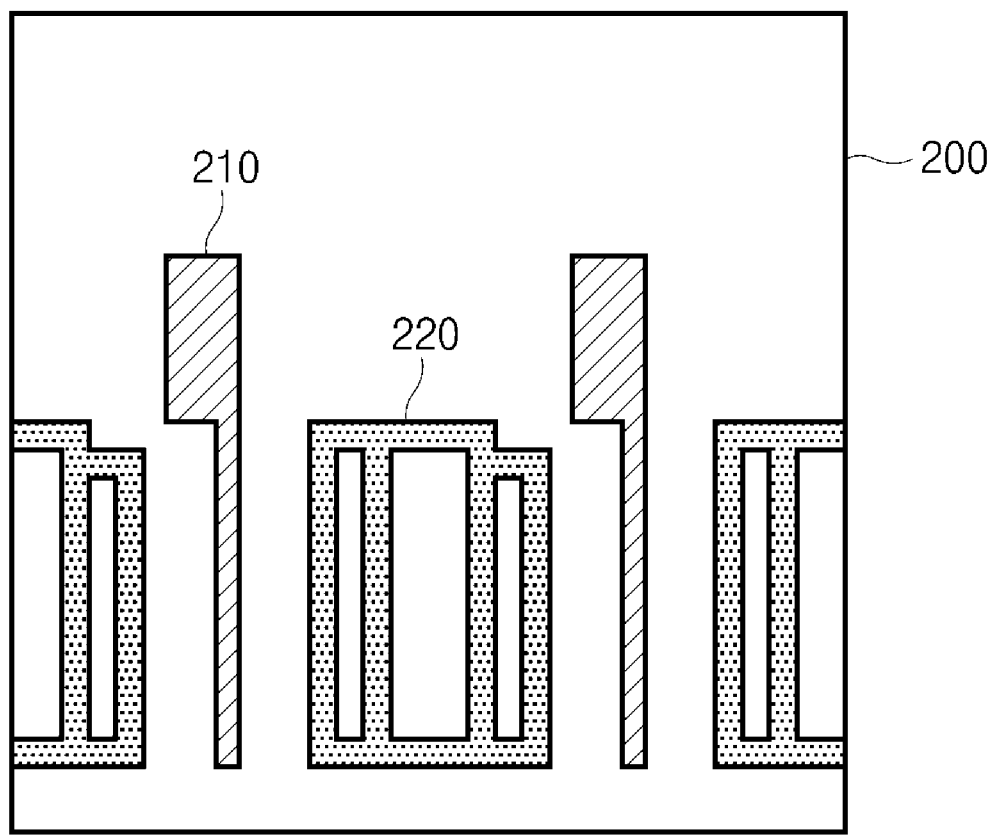

While the disclosed method is susceptible of embodiments in various forms, there are illustrated in the drawings (and will hereafter be described) specific embodiments, with the understanding that the disclosure is intended to be illustrative, and is not intended to limit the invention to the specific embodiments described and illustrated herein.

DETAILED DESCRIPTION OF THE PREFERRED EMBODIMENTS

Figure 3A:
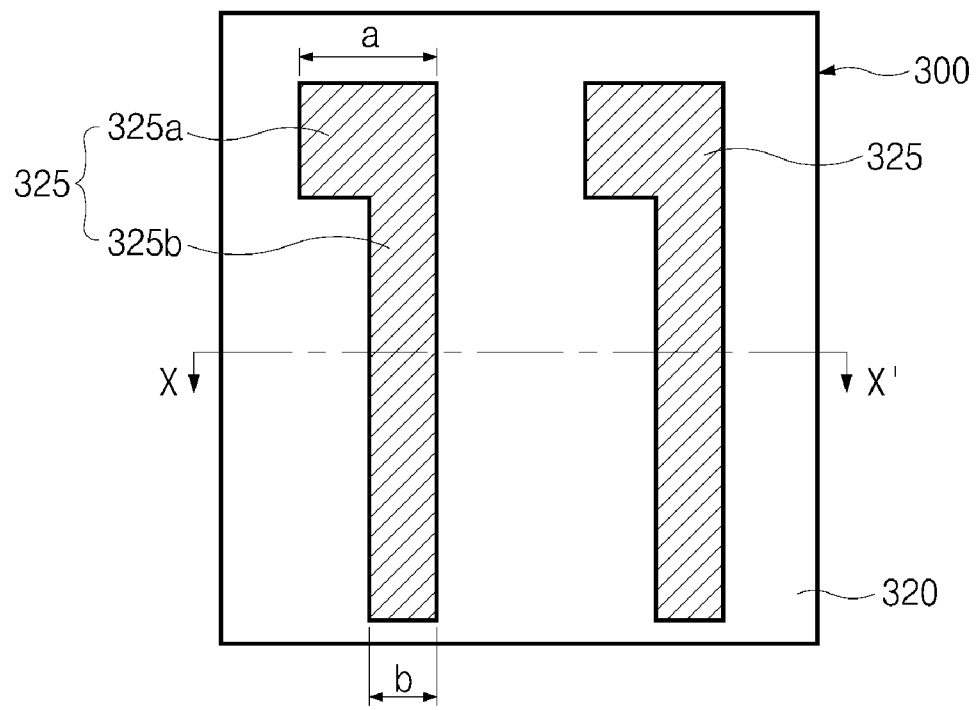
Figure 3A:
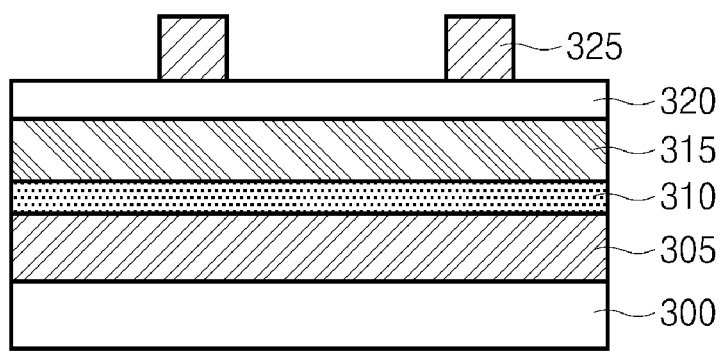

FIGS. 3a to 3h are diagrams illustrating a method for manufacturing a semiconductor device according to an embodiment of the invention. FIGS. 3a(i) to 3h(i) are plane diagrams, and FIGS. 3a(ii) to 3h(ii) are cross-sectional diagrams taken along line X-X' of FIGS. 3a(i) to 3h(i), respectively.

Referring to FIG. 3a, an underlying layer 305, a first hard mask layer 310, a second hard mask layer 315, and anti-reflection film 320, and a first photoresist pattern 325, defining a pattern region, are formed over a semiconductor substrate 300. The first photoresist pattern 325 includes a pad pattern 325a having a critical dimension 'a' and a line pattern 325b having a critical dimension 'b', wherein the critical dimension 'a' is greater than the critical dimension 'b' (i.e., a>b). The pad pattern 325a is contacted with the line pattern 325b. One side of the pad pattern 325a contacts with that of the line pattern 325b, and an upper side of the pad pattern 325a is aligned with that of the line pattern 325b.

The first photoresist pattern 325 may be formed to have a line type (not shown). A critical dimension (CD) of the first photoresist pattern 325 may be formed to be larger than that of a final pattern because an exposure process margin can be improved as pattern size becomes larger. The first photoresist pattern 325 may be formed to be one- to three-times larger than a final pattern. The first photoresist pattern 325 may be formed by exposure to a light source selected from the group consisting of I-Line, KrF, ArF, EUV, and $F_2$, and combinations thereof.

Figure 3B:
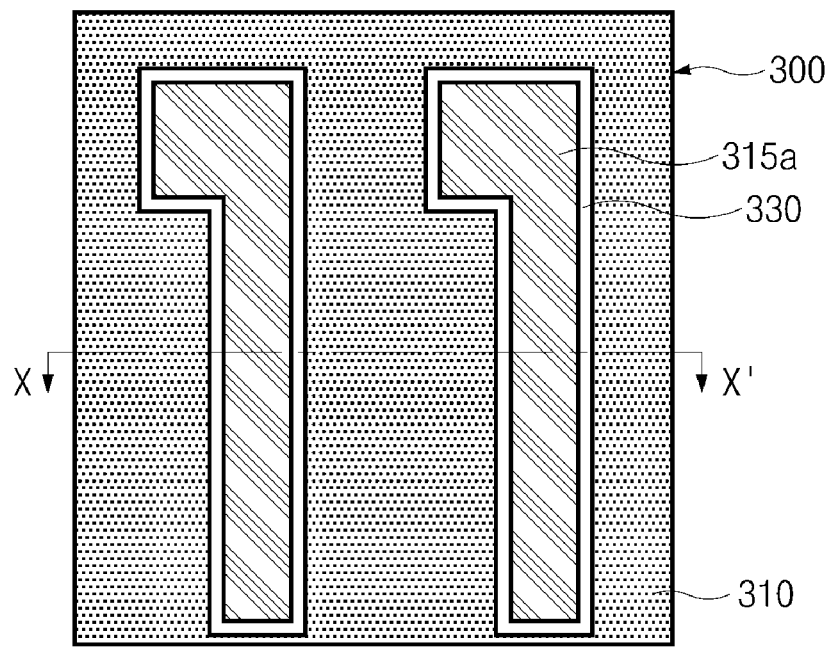
Figure 3B:
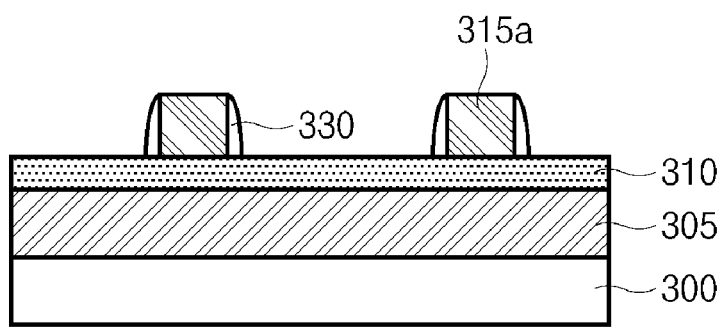

Referring to FIG. 3b, the anti-reflection film 320 and the second hard mask layer 315 are etched with the first photoresist pattern 325. The first photoresist pattern 325 and the etched anti-reflection film 320 are removed to form a second hard mask pattern 315a. A spacer layer (not shown) having a given thickness is formed over the resulting structure, including the second hard mask pattern 315a. A blanket-etching process is performed to deposit a spacer 330 at sidewalls of the second hard mask pattern 315a.

Figure 3C:
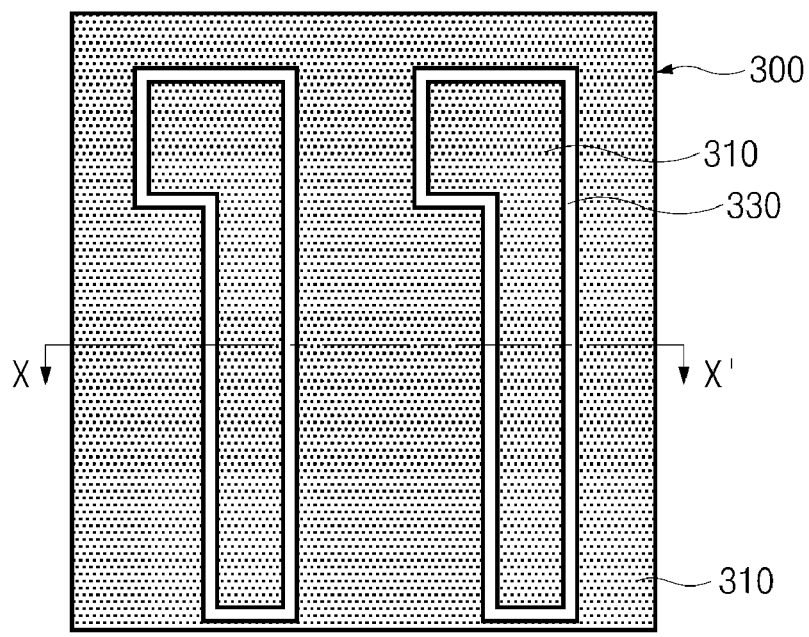
Figure 3C:
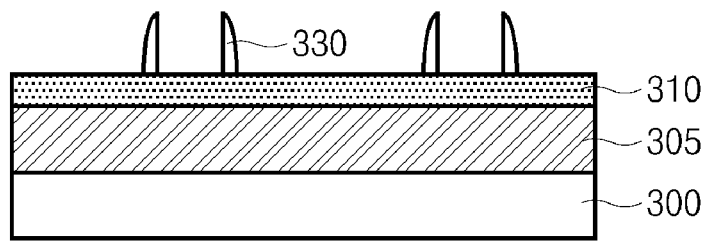

Referring to FIG. 3c, the second hard mask pattern 315a is removed so that the spacer 330 formed at the sidewalls of the second hard mask pattern 315a may remain. As shown in FIG. 3c, the spacer 330 is formed along the sidewall of the removed pattern 315, so that the spacer 330 is formed to have a close curved line (curved in the direction of the removed pattern 315).

Figure 3D:
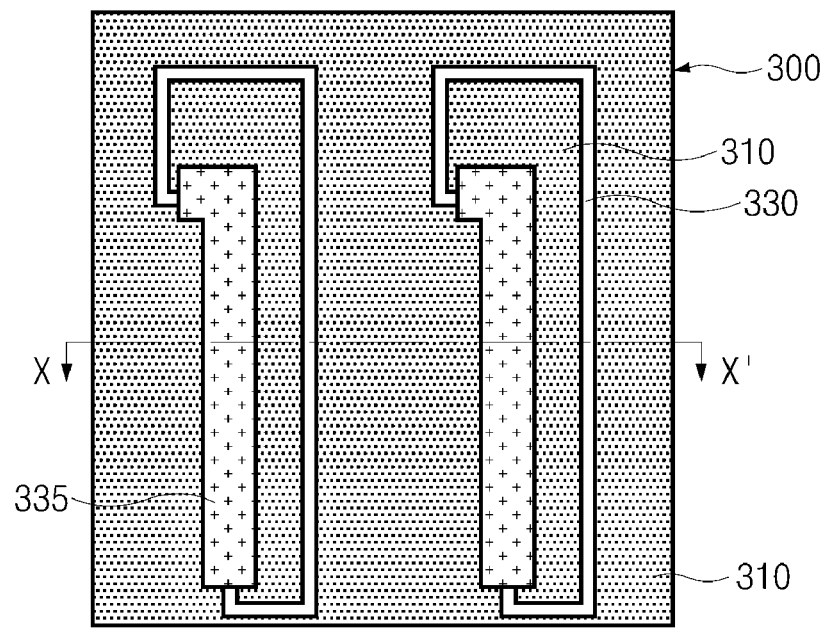
Figure 3D:
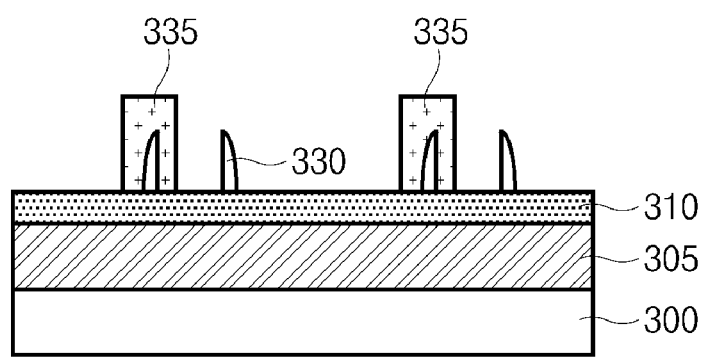

Referring to FIG. 3d, a second photoresist pattern 335 is formed to open a part of the spacer 330. The second photoresist pattern 335 is formed so that the spacer where a final pattern is formed may not be open. More specifically, and referring to FIG. 3d(i), the second photoresist pattern 335 is formed to open the spacer 330, which is formed outside of the spacer 330 formed to have a close curved line.

Referring to FIG. 3d(ii), through a photoresist coating and a photo lithography the second photoresist pattern 335 is formed over a side of the spacer 330 so that the other side of the spacer 330 may be exposed.

An exposure process for forming the second photoresist pattern 335 is performed with a light source selected from the group consisting of I-Line, KrF, ArF, EUV, and $F_2$ and combinations thereof.

Figure 3E:
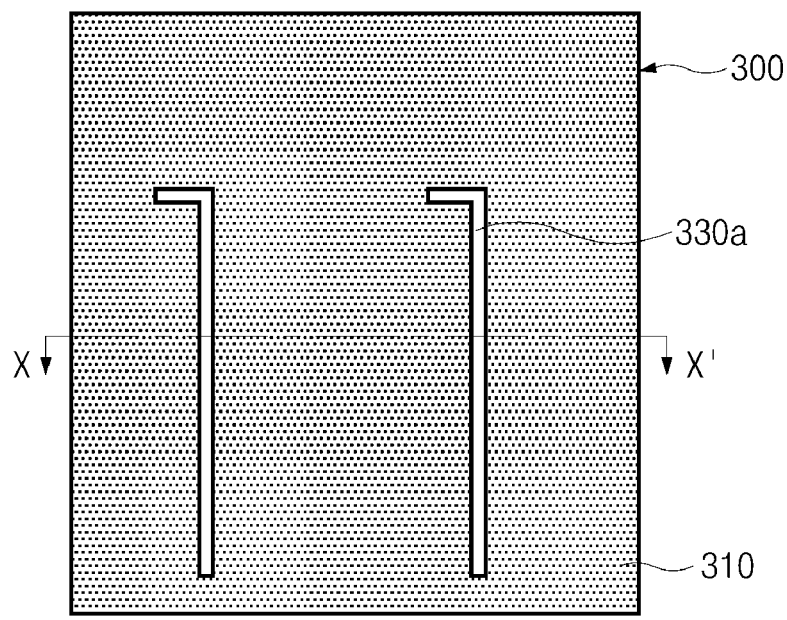
Figure 3E:
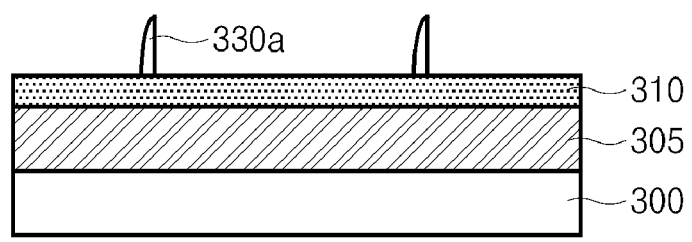

Referring to FIG. 3e, the spacer 330 exposed by the second photoresist pattern 335 is removed to form a spacer pattern 330a where a final pattern is formed. The spacer pattern 330a is formed to have a stepped-shape, shown in FIG. 3e, for example. A CD of the top surface having a stepped-shape may be formed smaller than that of the side having a stepped-shape.

When the second hard mask pattern 315a of FIG. 3b has a line type, the spacer pattern 330a is formed to have a line type.

Figure 3F:
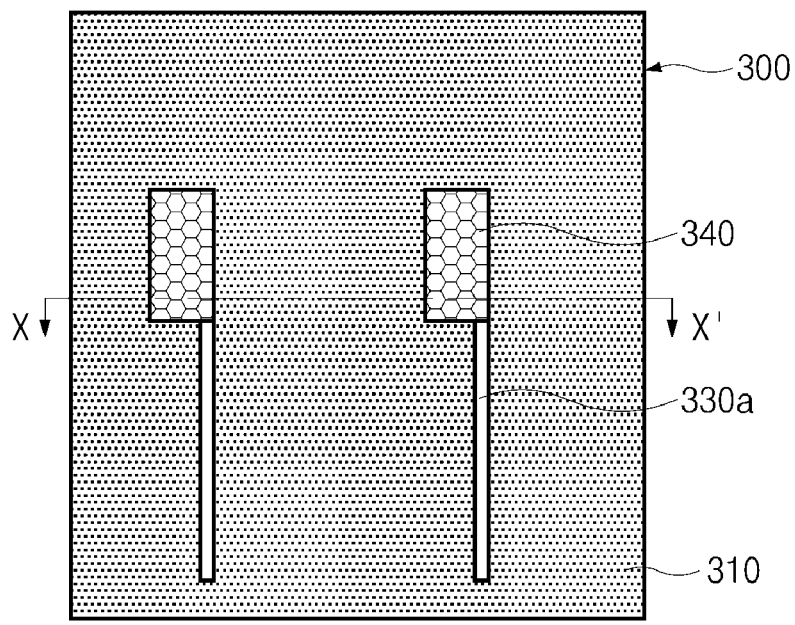
Figure 3F:
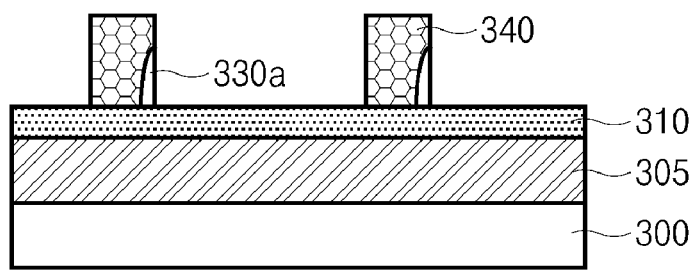

Referring to FIG. 3f, a third photoresist pattern 340 is formed which is overlapped with the top surface of the spacer pattern 330a and a part of the side adjacent to the top surface. The third photoresist pattern 340 is formed to have a pad type. A side of the third photoresist pattern 340 is aligned with a side of the spacer pattern 330a. A CD of the minor axis of the third photoresist pattern 340 having a pad type is formed to be larger than that of the top surface of the spacer pattern 330a having a stepped-shape.

An exposure process for forming the third photoresist pattern 340 is performed with a light source selected from the group consisting of I-Line, KrF, ArF, EUV, and $F_2$ and combinations thereof.

Figure 3G:
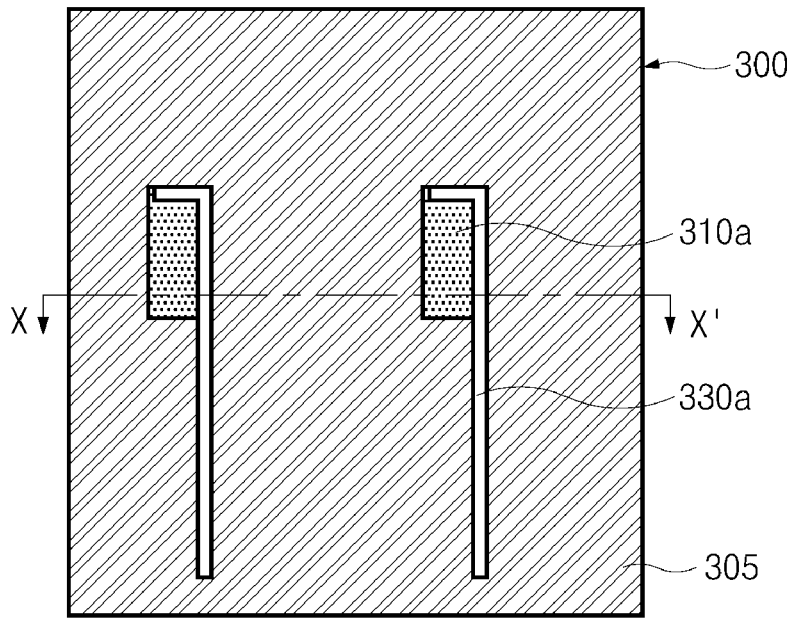
Figure 3G:
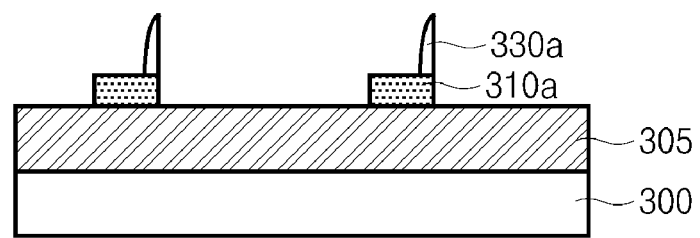

Referring to FIG. 3g, the first hard mask layer 310 is etched with the third photoresist pattern 340 and the spacer pattern 330a as a mask to form a first hard mask pattern 310a. Thereafter, the third photoresist pattern 340 is removed.

The first hard mask pattern 310a formed in the bottom of the spacer pattern 330a may be formed to have a CD larger than that of the spacer pattern 330a.

Figure 3H:
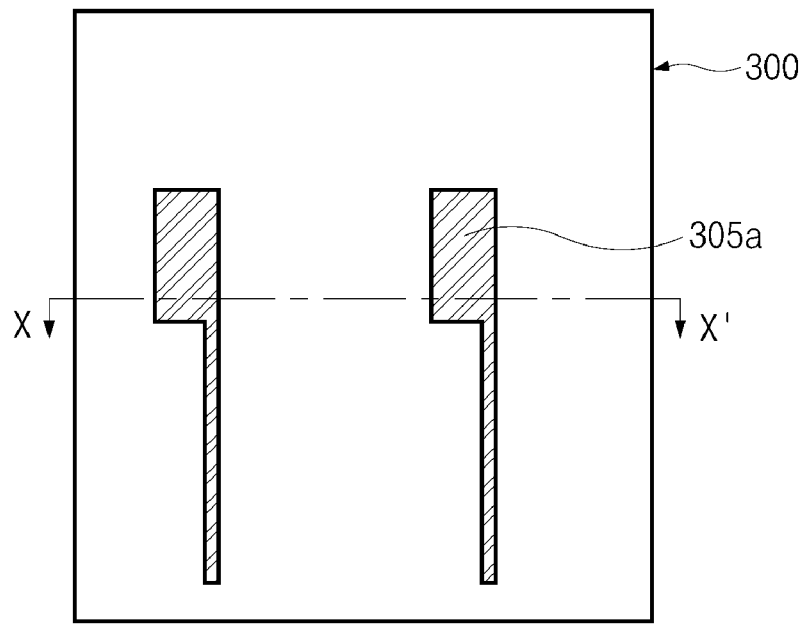
Figure 3H:
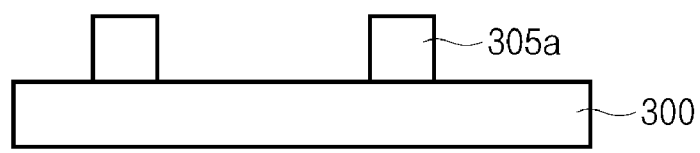

Referring to FIG. 3h, the underlying layer 305 is etched with the first hard mask pattern 310a and the spacer pattern 330a as a mask to form an underlying pattern 305a, to obtain a desired fine pattern.

The underlying pattern 305a, defining an isolated pattern formed in a peripheral circuit region, is formed by a SPT process. As a result, a process margin can be improved without a dummy pattern.

As described above, according to an embodiment of the invention, a method for manufacturing a semiconductor device includes forming an isolated pattern having a fine CD by a SPT process, thereby improving a DOF margin and an EL margin to obtain a high-integrated transistor.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, the method comprising:
   forming an underlying layer and a first hard mask layer over a semiconductor substrate;
   forming a second hard mask pattern, having a line type pattern, over the first hard mask layer;
   forming parallel spacers along the second hard mask line pattern by forming a first sidewall spacer along one sidewall of the line pattern and forming a second sidewall spacer along an opposing sidewall of the line pattern;
   removing the second hard mask pattern so that the parallel spacers remain;
   forming a first photoresist pattern overlapping one of the first sidewall spacer or second sidewall spacer;
   removing the exposed sidewall spacer with the first photoresist pattern as a mask to form a spacer pattern;
   forming a second photoresist pattern, the second photoresist pattern having a pad pattern over the first hard mask layer and overlapping a part of the spacer pattern;
   etching the first hard mask layer, with the second photoresist pattern and the spacer pattern as a mask, to form a first hard mask pattern; and, etching the underlying layer with the first hard mask pattern as a mask, to form an underlying pattern.

2. The method according to claim 1, wherein the spacer forming step comprises:
forming a spacer material layer over the second hard mask pattern; and
blanket-etching the spacer material layer to form the spacer.

3. The method according to claim 1 further comprising:
removing the second photoresist pattern and the spacer pattern.

4. The method according to claim 1, wherein forming the spacer pattern comprises removing the exposed sidewall spacer by etching.

5. The method according to claim 1, wherein a critical dimension (CD) of the second photoresist pattern is larger than that of the spacer pattern.

6. The method according to claim 1, wherein the second photoresist pattern overlaps with an end part of the spacer pattern.

7. The method according to claim 1, wherein a side of the second photoresist pattern is aligned with a side of the spacer pattern.

8. A method for manufacturing a semiconductor device, the method comprising:
forming an underlying layer and a first hard mask layer over a semiconductor substrate;
forming a second hard mask pattern, the pattern comprising a pad pattern and a line pattern, over the first hard mask layer;
forming parallel spacers along the second hard mask line pattern by forming a first sidewall spacer along one sidewall of the line pattern and forming a second sidewall spacer along an opposing sidewall of the line pattern;
removing the second hard mask pattern so that the parallel spacers remain;
forming a first photoresist pattern overlapping one of the first sidewall spacer or second sidewall spacer;
removing the exposed sidewall spacer with the first photoresist pattern as a mask to form a stepped-shaped spacer pattern;
forming a second photoresist pattern over the first hard mask layer and overlapping a part of the stepped-shaped spacer pattern;
etching the first hard mask layer with the second photoresist pattern and the stepped-shaped spacer pattern as a mask, to form a first hard mask pattern; and,
etching the underlying layer, with the first hard mask pattern as a mask, to form an underlying pattern.

9. The method according to claim 8, wherein a CD of the second hard mask pattern is formed one to three times larger than that of the underlying pattern.

10. The method according to claim 8, wherein the pad pattern is contacted with the the line pattern.

11. The method according to claim 8, wherein a CD of the pad pattern is larger than that of the line pattern.

12. The method according to claim 8, wherein the step of forming parallel spacers at sidewalls of the second hard mask pattern comprises:
forming a spacer material layer over the second hard mask pattern; and
blanket-etching the spacer material layer to form the spacers.

13. The method according to claim 8 further comprising:
removing the second photoresist pattern and the stepped-spacer pattern.

14. The method according to claim 8, wherein forming the stepped-spacer pattern comprises removing the exposed sidewall spacer by etching.

15. The method according to claim 8, wherein the second photoresist pattern is aligned with a side of the stepped-shaped spacer pattern.

16. The method according to claim 8, wherein a CD of the minor axis of the second photoresist pattern is larger than that of a top surface of the stepped-shaped spacer pattern.

17. The method according to claim 8, wherein the second photoresist-pattern is formed by exposure to a light source selected from the group consisting of I-Line, KrF, ArF, EUV, and $F_2$, and combinations thereof.

* * * * *